US012220900B2

(12) United States Patent
Wei et al.

(10) Patent No.: US 12,220,900 B2
(45) Date of Patent: Feb. 11, 2025

(54) HOLE-PUNCH SCREEN AND ELECTRONIC DEVICE

(71) Applicant: VIVO MOBILE COMMUNICATION CO., LTD., Guangdong (CN)

(72) Inventors: Hongyang Wei, Guangdong (CN); Guanheng Li, Guangdong (CN)

(73) Assignee: VIVO COMMUNICATION CO., LTD., Guangdong (CN)

( * ) Notice: Subject to any disclaimer, the term of this patent is extended or adjusted under 35 U.S.C. 154(b) by 248 days.

(21) Appl. No.: 17/750,130

(22) Filed: May 20, 2022

(65) Prior Publication Data

US 2022/0274370 A1 Sep. 1, 2022

Related U.S. Application Data

(63) Continuation of application No. PCT/CN2020/130232, filed on Nov. 19, 2020.

(30) Foreign Application Priority Data

Nov. 22, 2019 (CN) .......................... 201911158728.6

(51) Int. Cl.
*G02F 1/1335* (2006.01)
*B32B 3/24* (2006.01)
(Continued)

(52) U.S. Cl.
CPC ............... *B32B 3/266* (2013.01); *B32B 3/30* (2013.01); *B32B 5/18* (2013.01); *B32B 7/12* (2013.01);
(Continued)

(58) Field of Classification Search
None
See application file for complete search history.

(56) References Cited

U.S. PATENT DOCUMENTS 5,071,229 A * 12/1991 Oaki .................... G02B 27/281
349/200
9,591,111 B1 * 3/2017 Holmes ................. H04M 1/027
(Continued)

FOREIGN PATENT DOCUMENTS

CN  101989007 A * 3/2011
CN  102540581 A   7/2012
(Continued)

OTHER PUBLICATIONS

Machine Translation of CN-107272242-A, Oct. 2017 (Year: 2017).*
(Continued)

*Primary Examiner* — Jeffrey A Vonch
(74) *Attorney, Agent, or Firm* — BROOKS KUSHMAN P.C.

(57) ABSTRACT

A hole-punch screen includes a light-transmitting cover, a polarizer, and a glass component, where the polarizer is attached to the light-transmitting cover, the polarizer is provided with a first through hole, and the first through hole is filled with optical clear glue; and the glass component is attached to the polarizer so that the polarizer is located between the light-transmitting cover and the glass component, and the glass component is provided with a second through hole at a position corresponding to the first through hole.

15 Claims, 2 Drawing Sheets

(51) Int. Cl.

| | | |
|---|---|---|
| *B32B 3/26* | (2006.01) | |
| *B32B 3/30* | (2006.01) | |
| *B32B 5/18* | (2006.01) | |
| *B32B 7/12* | (2006.01) | |
| *B32B 17/10* | (2006.01) | |
| *G02B 5/30* | (2006.01) | |
| *G02F 1/13357* | (2006.01) | |
| *G02F 1/1339* | (2006.01) | |
| *H04M 1/02* | (2006.01) | |
| B32B 17/06 | (2006.01) | |
| G02B 3/00 | (2006.01) | |
| G02F 1/1333 | (2006.01) | |
| G06F 1/16 | (2006.01) | |
| H04N 23/55 | (2023.01) | |
| H04N 23/57 | (2023.01) | |
| H10K 50/842 | (2023.01) | |
| H10K 50/86 | (2023.01) | |
| H10K 59/12 | (2023.01) | |

(52) U.S. Cl.
CPC ..... *G02B 5/3025* (2013.01); *G02F 1/133526* (2013.01); *G02F 1/133528* (2013.01); *G02F 1/13392* (2013.01); *H04M 1/0264* (2013.01); B32B 17/066 (2013.01); B32B 17/10293 (2013.01); B32B 2307/412 (2013.01); B32B 2307/418 (2013.01); B32B 2307/42 (2013.01); B32B 2457/20 (2013.01); G02B 3/0037 (2013.01); G02B 2003/0093 (2013.01); G02B 5/30 (2013.01); G02B 5/3033 (2013.01); G02F 1/1333 (2013.01); G02F 1/133606 (2013.01); G02F 1/133607 (2021.01); G02F 1/1339 (2013.01); G02F 1/13394 (2013.01); G06F 1/1637 (2013.01); G06F 1/1686 (2013.01); H04M 1/0266 (2013.01); H04N 23/55 (2023.01); H04N 23/57 (2023.01); H10K 50/8426 (2023.02); H10K 50/86 (2023.02); H10K 59/12 (2023.02)

(56) References Cited

U.S. PATENT DOCUMENTS

| | | | | |
|---|---|---|---|---|
| 9,735,185 B1* | 8/2017 | Evans, V | ............. | G06F 1/1605 |
| 10,935,850 B1* | 3/2021 | Hsu | ............. | H04M 1/0264 |
| 2008/0252769 A1* | 10/2008 | Verstegen | ............. | H04N 23/69 |
| | | | | 348/335 |
| 2009/0147208 A1* | 6/2009 | Tatemori | ............. | G02F 1/13394 |
| | | | | 349/156 |
| 2009/0190227 A1* | 7/2009 | Yu | ............. | G02B 3/00 |
| | | | | 359/619 |
| 2011/0261283 A1* | 10/2011 | Kim | ............. | H04N 23/57 |
| | | | | 349/58 |
| 2012/0105400 A1* | 5/2012 | Mathew | ............. | G06F 1/1686 |
| | | | | 345/207 |
| 2012/0200816 A1 | 8/2012 | Krasnov et al. | | |
| 2012/0206669 A1* | 8/2012 | Kim | ............. | G02F 1/133308 |
| | | | | 349/153 |
| 2012/0327325 A1* | 12/2012 | Park | ............. | G06F 1/1686 |
| | | | | 349/58 |
| 2013/0107373 A1* | 5/2013 | Takumi | ............. | G02B 3/00 |
| | | | | 83/13 |
| 2013/0201436 A1* | 8/2013 | Choi | ............. | G02F 1/133526 |
| | | | | 349/193 |
| 2013/0258234 A1* | 10/2013 | Park | ............. | G02F 1/133528 |
| | | | | 349/58 |
| 2015/0241270 A1 | 8/2015 | Matsuno et al. | | |
| 2017/0187934 A1* | 6/2017 | Kwak | ............. | G06F 1/1637 |
| 2017/0248810 A1* | 8/2017 | Shibano | ............. | G02F 1/1368 |
| 2017/0289324 A1* | 10/2017 | Yeo | ............. | G03B 29/00 |
| 2017/0308234 A1* | 10/2017 | Li | ............. | G06F 1/1626 |
| 2018/0011373 A1* | 1/2018 | Zhou | ............. | G02F 1/13454 |
| 2018/0013094 A1 | 1/2018 | Kim et al. | | |
| 2018/0151641 A1 | 5/2018 | Choo et al. | | |
| 2019/0243180 A1* | 8/2019 | Nakamura | ........ | G02F 1/133308 |
| 2019/0245957 A1 | 8/2019 | Bui et al. | | |
| 2019/0278132 A1 | 9/2019 | Nakamura et al. | | |
| 2019/0333960 A1* | 10/2019 | Li | ............. | G02F 1/133615 |
| 2019/0384121 A1* | 12/2019 | Nishiwaki | ........ | G02F 1/133528 |
| 2020/0050047 A1* | 2/2020 | Son | ............. | H04M 1/0264 |
| 2020/0117034 A1* | 4/2020 | Yin | ............. | G06F 1/1643 |
| 2020/0142236 A1* | 5/2020 | Cheng | ............. | G02F 1/13394 |
| 2020/0166789 A1* | 5/2020 | Yu | ............. | H04M 1/0266 |
| 2020/0174301 A1* | 6/2020 | Tien | ............. | H04M 1/0264 |
| 2020/0236259 A1 | 7/2020 | Nakamura et al. | | |
| 2020/0292871 A1* | 9/2020 | Inoue | ............. | G02F 1/133308 |
| 2020/0292882 A1* | 9/2020 | Nakamura | ........ | G02F 1/136286 |
| 2021/0005836 A1* | 1/2021 | Yee | ............. | H10K 59/40 |
| 2021/0013454 A1* | 1/2021 | Xie | ............. | H10K 59/38 |
| 2021/0033919 A1 | 2/2021 | Huang et al. | | |
| 2021/0051221 A1* | 2/2021 | Sim | ............. | G02B 13/006 |
| 2021/0072594 A1* | 3/2021 | Zhang | ............. | G02F 1/133603 |
| 2021/0104583 A1* | 4/2021 | Jeon | ............. | G06F 1/1605 |
| 2021/0127043 A1* | 4/2021 | Jiang | ............. | G06F 1/1686 |
| 2021/0135151 A1* | 5/2021 | Baek | ............. | H04M 1/0237 |
| 2021/0191112 A1* | 6/2021 | Yamashita | ........ | G02B 3/00 |
| 2021/0271296 A1* | 9/2021 | Liu | ............. | G06F 1/1656 |
| 2021/0356641 A1* | 11/2021 | Liu | ............. | G02B 5/3041 |
| 2021/0405434 A1* | 12/2021 | Zhang | ............. | G02F 1/133354 |
| 2021/0405440 A1* | 12/2021 | Yu | ............. | H04M 1/0266 |
| 2021/0405446 A1* | 12/2021 | Yu | ............. | G02F 1/133331 |
| 2022/0004050 A1* | 1/2022 | Yu | ............. | G02F 1/133512 |
| 2022/0006045 A1* | 1/2022 | Wang | ............. | G02F 1/133331 |
| 2022/0026762 A1* | 1/2022 | Ma | ............. | G02F 1/133528 |
| 2022/0026771 A1* | 1/2022 | Yan | ............. | G02B 6/0088 |
| 2022/0187654 A1* | 6/2022 | Luo | ............. | G02F 1/133723 |
| 2022/0191367 A1* | 6/2022 | Liu | ............. | H04N 23/55 |
| 2022/0197339 A1* | 6/2022 | Bao | ............. | H04N 23/57 |
| 2022/0214569 A1* | 7/2022 | Li | ............. | G02F 1/133514 |
| 2022/0246884 A1* | 8/2022 | Yan | ............. | H10K 59/121 |

FOREIGN PATENT DOCUMENTS

| | | | | | |
|---|---|---|---|---|---|
| CN | 107229148 | A | * | 10/2017 | ......... G02F 1/1333 |
| CN | 107272242 | A | * | 10/2017 | ......... G02F 1/1333 |
| CN | 107395928 | A | | 11/2017 | |
| CN | 107946341 | A | | 4/2018 | |
| CN | 109100891 | A | | 12/2018 | |
| CN | 109143648 | A | * | 1/2019 | ......... G02F 1/1333 |
| CN | 109164648 | A | | 1/2019 | |
| CN | 109194787 | A | | 1/2019 | |
| CN | 109283736 | A | | 1/2019 | |
| CN | 109407375 | A | | 3/2019 | |
| CN | 109531280 | A | * | 3/2019 | ............. B24B 1/00 |
| CN | 109545826 | A | | 3/2019 | |
| CN | 109637378 | A | | 4/2019 | |
| CN | 109669291 | A | * | 4/2019 | ......... G02F 1/1333 |
| CN | 109733034 | A | | 5/2019 | |
| CN | 109782461 | A | | 5/2019 | |
| CN | 109856842 | A | * | 6/2019 | |
| CN | 109856849 | A | * | 6/2019 | |
| CN | 110133902 | A | | 8/2019 | |
| CN | 110136573 | A | | 8/2019 | |
| CN | 110138935 | A1 | | 8/2019 | |
| CN | 110187567 | A | | 8/2019 | |
| CN | 209233928 | U | | 8/2019 | |
| CN | 209267626 | U | * | 8/2019 | |
| CN | 110208891 | A | | 9/2019 | |
| CN | 110208976 | A | | 9/2019 | |
| CN | 209356799 | U | * | 9/2019 | |
| CN | 209373166 | U | * | 9/2019 | |
| CN | 110456545 | A | | 11/2019 | |
| CN | 110867136 | A | | 3/2020 | |
| CN | 111025717 | A | * | 4/2020 | |
| GB | 2279171 | A | * | 12/1994 | ....... G02F 1/133526 |
| JP | H11316376 | A | | 11/1999 | |
| JP | 2017048090 | A | * | 3/2017 | |
| JP | 2018085114 | A | | 5/2018 | |
| JP | 2019158956 | A | | 9/2019 | |
| KR | 2011061176 | A | * | 6/2011 | |

(56) References Cited

FOREIGN PATENT DOCUMENTS

| KR | 20190091711 A | 8/2019 | | |
|---|---|---|---|---|
| WO | 2018216545 A1 | 11/2018 | | |
| WO | WO-2020262143 A1 | * | 12/2020 | |
| WO | WO-2021033919 A1 | * | 2/2021 | ............... G02B 1/10 |
| WO | WO-2021056685 A1 | * | 4/2021 | ........... G02F 1/1333 |
| WO | WO-2021079612 A1 | * | 4/2021 | ......... B32B 17/1033 |
| WO | WO-2021079613 A1 | * | 4/2021 | ............. B32B 27/06 |
| WO | WO-2021079614 A1 | * | 4/2021 | ............. B32B 27/16 |
| WO | WO-2021079621 A1 | * | 4/2021 | ........... B32B 15/092 |
| WO | WO-2021079622 A1 | * | 4/2021 | ........... B32B 15/092 |
| WO | WO-2021079623 A1 | * | 4/2021 | ........... B32B 15/092 |

OTHER PUBLICATIONS

Machine Translation of CN-107395928-A, Nov. 2017 (Year: 2017).*
Machine Translation of CN-109164648-A, Jan. 2019 (Year: 2019).*
Machine Translation of CN-109637378-A, Apr. 2019 (Year: 2019).*
First Office Action for Japanese Application No. 2022-529743, dated May 1, 2023, 3 Pages.
First Office Action for Chinese Application No. 201911158728.6, dated Mar. 3, 2021, 8 Pages.
International Search Report and Written Opinion for Application No. PCT/CN2020/130232, dated Feb. 19, 2021, 10 Pages.
Zhou, Hua, "Study on Cell Gap Process of TPT LCD and the Impact of Display Effect," Master's Dissertation submitted to Jiao Tong University, School of Electronic, Information and Electrical Engineering, Apr. 2014, Shanghai, China, 65 Pages.
Wu.et al., "Advanced Organic Light-Emitting Devices for Enhancing Display Performances," Journal of Display Technology, Dec. 2005, pp. 248-266, vol. 01, No. 2, IEEE (19 Pages).
Extended European Search Report Application No. 20891282.4-1224, dated Dec. 8, 2022, 8 pages.

* cited by examiner

HOLE-PUNCH SCREEN AND ELECTRONIC DEVICE

CROSS-REFERENCE TO RELATED APPLICATIONS

This application is a continuation of International Application No. PCT/CN2020/130232 filed on Nov. 19, 2020, which claims priority to Chinese Patent Application No. 201911158728.6, filed on Nov. 22, 2019, which are incorporated herein by reference in their entireties.

TECHNICAL FIELD

The present invention relates to the field of communications device technologies, and in particular to a hole-punch screen and an electronic device.

BACKGROUND

The hole-punch screen is a design scheme with a front camera of a mobile phone arranged underneath a display screen, including two designs: punching a through hole and providing a transparent hole, into a display panel. Being provided right underneath the display screen, the camera occupies no mobile phone frame space, allowing an ultra-narrow frame, a higher screen-to-body ratio, and a better full screen effect. The transparent hole scheme, also known as blind hole scheme, can achieve a smaller aperture with little impact on an active area (AA) of the display screen, and therefore has been widely adopted by mobile phone manufacturers.

An AMOLED hole-punch screen adopting the blind hole scheme needs to have a hole punched in a polarizer (POL) at a position corresponding to the transparent hole of the panel, so that light can pass through a display module to reach the camera underneath the panel. Because the POL has a thickness (typically 70-200 μm), the POL hole cannot be fully filled at the edge with an optical clear adhesive (OCA) currently in use for full fit and fit bubbles exist there, which affect appearance and reliability testing.

SUMMARY

The present invention discloses a hole-punch screen and an electronic device, to resolve a problem of bubbles present in a punched hole in the prior art.

Based on the foregoing objective, an embodiment of the present invention discloses a hole-punch screen, including:
  a light-transmitting cover;
  a polarizer, where the polarizer is attached to the light-transmitting cover, the polarizer is provided with a first through hole, and the first through hole is filled with optical clear glue; and
  a glass component, where the glass component is attached to the polarizer so that the polarizer is located between the light-transmitting cover and the glass component, and the glass component is provided with a second through hole at a position corresponding to the first through hole.

For the foregoing objective, an embodiment of the present invention further discloses an electronic device, including the foregoing hole-punch screen.

The technical solutions provided in the present invention can achieve the following beneficial effects:
  In the hole-punch screen disclosed in the present invention, before the polarizer is attached to the light-transmitting cover, the first through hole is first filled with the optical clear glue, which is in liquid form so that the first through hole can be fully filled and no bubbles is generated in the first through hole when the optical clear glue is solidified, thereby not affecting appearance and reliability testing.

BRIEF DESCRIPTION OF DRAWINGS

The drawings described herein are used to disclose a further understanding about the present invention, and constitute a part of the present invention. They are used to explain the present invention without constituting any inappropriate limitation on the present invention. In the drawings.

Reference signs are described as follows: 100. light-transmitting cover; 200. polarizer; 210. optical clear glue; 220. first through hole; 300. glass component; 310. upper glass; 311. first recess; 312. first recess bottom; 313. first groove; 320. lower glass; 321. second recess; 322. second groove; 323. second recess bottom; 330. foam; 331. second through hole; 340. frame adhesive; 350. support column; and 400. optical clear double-sided adhesive.

DETAILED DESCRIPTION

To make the objectives, technical solutions, and advantages of the present invention clearer, the following clearly describes the technical solutions of the present invention with reference to specific embodiments of the present invention and corresponding drawings. Apparently, the described embodiments are merely some rather than all the embodiments of the present invention. Based on the embodiments of the present invention, all other embodiments obtained by a person of ordinary skill in the art without creative efforts shall fall within the protection scope of the present invention.

The technical solutions disclosed in the embodiments of the present invention are described in detail below with reference to the accompanying drawings.

Figure 1:
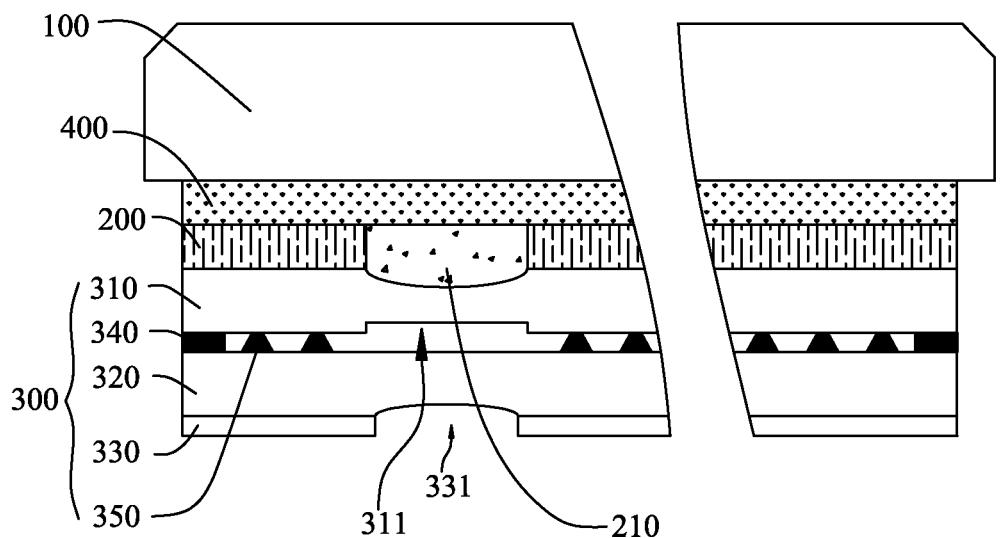
FIG. 1 is a schematic diagram of a hole-punch screen according to an embodiment of the present invention.
Figure 2:
FIG. 2 is a schematic diagram of a polarizer according to an embodiment of the present invention.

Referring to FIG. 1 and FIG. 2, an embodiment of the present invention discloses a hole-punch screen, which includes a light-transmitting cover 100, a polarizer 200, and a glass component 300.

The light-transmitting cover 100 may be a clear part such as a glass cover, which mainly plays a protective role.

The polarizer 200 is attached to the light-transmitting cover 100, the polarizer 200 is provided with a first through hole 220, and the first through hole 220 is filled with optical clear glue 210. The first through hole 220 can be fully filled with the optical clear glue 210, without affecting passage of light. Before the polarizer 200 is attached to the light-transmitting cover 100, the first through hole 220 is first filled with the optical clear glue 210, which is in liquid form and has good fluidity so that the first through hole 220 can be fully filled and no bubbles is generated in the first through hole 220 when the optical clear glue 210 is solidified, thereby not affecting appearance and reliability testing. In addition, the optical clear glue 210 and the polarizer 200 can be bonded together, which prevents displacement and helps subsequent installation of other components.

The glass component 300 is attached to the polarizer 200 so that the polarizer 200 is located between the light-transmitting cover 100 and the glass component 300. The glass component 300 is provided with a second through hole 331 at a position corresponding to the first through hole 220. The second through hole 331 cooperates with the first through hole 220 to allow light to pass through.

The glass component 300 may include upper glass 310, lower glass 320, support columns 350, and foam 330.

The upper glass 310 is directly attached to the polarizer 200, and the lower glass 320 is attached to the upper glass 310 via a frame adhesive 340. The frame adhesive 340 is located between the upper glass 310 and the lower glass 320, and the frame adhesive 340 is arranged in a ring along a circumferential direction of the upper glass 310 so that the frame adhesive 340 encloses an inner cavity between the upper glass 310 and the lower glass 320. The lower glass 320 is located on a side of the upper glass 310 facing away from the polarizer 200. In addition, a plurality of support columns 350 are also filled between the upper glass 310 and the lower glass 320, the plurality of support columns 350 are spaced apart between the upper glass 310 and the lower glass 320, and the plurality of support columns 350 are all located in the inner cavity. After the foam 330 is attached to the lower glass 320, the lower glass 320 is located between the upper glass 310 and the foam 330. The second through hole 331 is located in the foam 330, and the second through hole 331 and the first through hole 220 are arranged coaxially.

It should be noted that in a region that is between the upper glass 310 and the lower glass 320 and that corresponds to the first through hole 220, no support column 350 is provided, so as to avoid affecting the propagation of light.

In some implementations of this embodiment, the upper glass 310 may be provided with a first recess 311.

After the upper glass 310 is attached to the polarizer 200, because the upper glass 310 is in a suspended state at the first through hole 220 of the polarizer 200, the upper glass 310 is prone to deformation at that position during use, and its main deformation is manifested as a depression there in a direction facing away from the polarizer 200. In this case, a first groove 313 is formed on a side of the upper glass 310 facing the polarizer 200, and a protrusion is formed on a side of the upper glass 310 facing the lower glass 320. This depression has an effect that reflected light of incident light between the lower surface of the upper glass 310 and the upper surface of the lower glass 320 is likely to produce a thin film interference effect during use. This is mainly because of the spherical protrusion formed there by the upper glass 310.

To improve this situation, the first recess 311 may be provided in the upper glass 310, the first recess 311 is located on the side of the upper glass 310 facing toward the lower glass 320, with a position of the first recess 311 corresponding to the position of the first through hole 220. The provision of the first recess 311 in the upper glass 310 can change an angle of incident light passing through the upper glass 310 toward the lower glass 320, thereby relieving the thin film interference effect.

Figure 4:
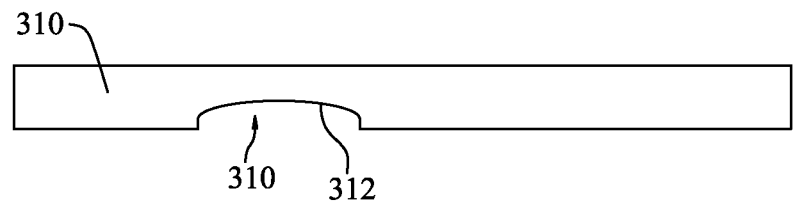
FIG. 4 is a schematic diagram of upper glass in a second state according to an embodiment of the present invention.

Further, referring to FIG. 4, FIG. 4 shows a state of the upper glass 310 with no depression. In some implementations of this embodiment, the first recess bottom 312 may alternatively be shaped into an arc surface, where the first recess bottom 312 is a recess bottom of the first recess 311. The first recess bottom 312 is in an arc shape in a depressed direction of the first recess 311, which means that an outer wall of the arc shape faces toward the first through hole 220.

The provision of the first recess bottom 312 with an arc surface can further change, when the upper glass 310 is depressed, a shape of a surface of the upper glass 310 at the depression facing toward the lower glass 320, thereby relieving the thin film interference effect.

Figure 3:
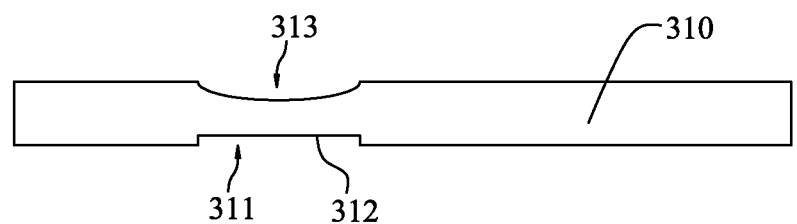
FIG. 3 is a schematic diagram of upper glass in a first state according to an embodiment of the present invention.

In an optional implementation of this embodiment, before transforming the first recess bottom 312 into an arc surface, the shape of the first groove 313 formed by the depression of the upper glass 310 can be measured first, and then the first recess bottom 312 can be ground into the same shape as the first groove 313. Referring to FIG. 3 (FIG. 3 shows a shape of the upper glass 310 with depression), when the first recess bottom 312 has the same shape as the first groove 313, the depression of the upper glass 310 causes the first recess bottom 312 to deform and become substantially flat, which can better relieve the film interference effect.

Figure 6:
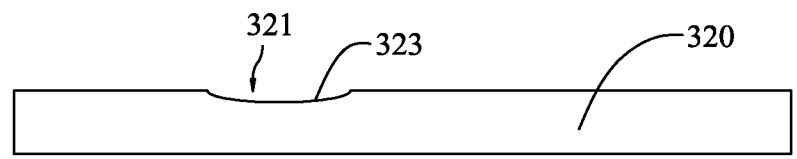
FIG. 6 is a schematic diagram of lower glass in a second state according to an embodiment of the present invention.

In addition, referring to FIG. 6, FIG. 6 shows a state of the lower glass 320 with no depression. A second recess 321 may also be provided in the lower glass 320, the second recess 321 is located on a side of the lower glass 320 facing the upper glass 310, and the second recess 321 is located at a position of the lower glass 320 corresponding to the second through hole 331.

The lower glass 320 is located between the upper glass 310 and the foam 330, and the foam 330 is provided with a second through hole 331 at a position corresponding to the first through hole 220. The lower glass 320 is suspended at the second through hole 331 of the foam 330. During use, the lower glass 320 is also prone to deformation at that position, and its main deformation is manifested as a depression there toward the upper glass 310. In this case, a second groove 322 is formed on a side of the lower glass 320 facing away from the upper glass 310, and a protrusion is formed on the side of the lower glass 320 facing the upper glass 310, which is also likely to cause light reflected between the lower surface of the upper glass 310 and the upper surface of the lower glass 320 to produce a thin film interference effect. The provision of the second recess 321 can effectively improve the above situation, and when the second recess 321 cooperates with the first recess 311, the thin film interference effect can be better relieved.

Further, in some implementations of this embodiment, the second recess bottom 323 may alternatively be shaped as an arc surface, where the second recess bottom 323 is a recess bottom of the second recess 321. The second recess bottom 323 is in an arc shape in a direction from the lower glass 320 to the foam 330, which means that an outer wall of the arc shape faces toward the second through hole 331.

The provision of the second recess bottom 323 with an arc surface may further change, when the lower glass 320 is depressed, a shape of a surface of the lower glass 320 facing toward the upper glass 310 at the depression, thereby relieving the thin film interference effect.

The first recess 311 can be provided in a cylindrical shape, the second recess 321 can be provided in a spherical shape, the first recess 311 and the second recess 321 are coaxially arranged, and both the first recess 311 and the second recess 321 are coaxial with the first through hole 220, so that four light-transmitting portions in the hole-punch screen, the first through hole 220, the first recess 311, the second recess 321, and the second through hole 331, are coaxially arranged, which facilitates passage of light.

In addition, a diameter of the first recess 311 may be equal to a diameter of the first through hole 220, a diameter of the second recess 321 may be equal to a diameter of the second through hole 331, and the diameter of the second through hole 331 is slightly smaller than the diameter of the first through hole 220.

Because the first through hole 220 and the second through hole 331 may be different in size for different electronic devices, the first recess 311 and the second recess 321 can also be adjusted appropriately in size and depth for different electronic devices to achieve suitable results.

Figure 5:
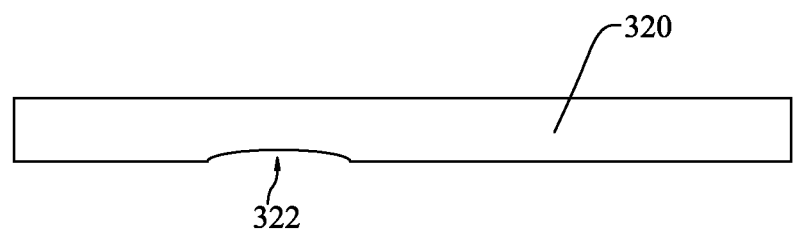
FIG. 5 is a schematic diagram of lower glass in a first state according to an embodiment of the present invention.

In an optional implementation of this embodiment, before transforming the second recess bottom 323 into an arc surface, the shape of the second groove 322 formed by the depression of the lower glass 320 can be measured first, and then the second recess bottom 323 can be ground into the same shape as the second groove 322. Referring to FIG. 5 (FIG. 5 shows a shape of the lower glass 320 with depression), when the second recess bottom 323 has the same shape as the second groove 322, the depression of the lower glass 320 causes the second recess bottom 323 to deform and become substantially flat, which can better relieve the film interference effect.

Because the first recess bottom 312 and the second recess bottom 323 are both flat when the upper glass 310 and the lower glass 320 are both depressed, the thin film interference effect can be substantially eliminated.

In some implementations of this embodiment, a contact area between the support columns 350 and the upper glass 310 is less than a contact area between the support columns 350 and the lower glass 320. This is because incident light generally enters from the upper glass 310 toward the lower glass 320, and therefore, reducing the contact area between the support columns 350 and the upper glass 310 can avoid formation of shadows.

Further, the support columns 350 may be arranged in a tapered shape, with a cross-sectional area of the support columns 350 gradually increasing in a direction of the upper glass 310 toward the lower glass 320.

In some implementations of this embodiment, the polarizer 200 is attached to the light-transmitting cover 100 via an optical clear double-sided adhesive 400. The attachment using the optical clear double-sided adhesive 400 has characteristics such as colorless and transparent, a light transmittance above 90%, good bonding strength, capable of being cured at room temperature or medium temperature, and small curing shrinkage. In this embodiment, the optical clear double-sided adhesive 400 may be an OCA optical adhesive. Certainly, the OCA optical adhesive is only an optional implementation of this embodiment. In other implementations, the polarizer 200 and the light-transmitting cover 100 may alternatively be attached by another optical clear double-sided adhesive 400 with a light transmittance of above 90%.

During assembly, the glass component 300 can be assembled first, and then the polarizer 200 and the upper glass 310 are attached together. The polarizer 200 and the glass component 300, after being securely attached, can be placed on a flat surface so that the polarizer 200 is located uppermost, and then the first through hole 220 in the polarizer 200 is filled with optical clear glue. Because in this case the upper glass 310 is depressed to form a first groove 313 communicating with the first through hole 220, when the optical clear glue is filled, a volume of the optical clear glue needs to be greater than a capacity of the first through hole 220, so that the optical clear glue also fills up the first groove 313, which can avoid a gap between the polarizer 200 and the upper glass 310. Finally, the optical clear double-sided adhesive 400 is used to bond the light-transmitting cover 100 to the polarizer 200 to complete the assembly.

To avoid volume shrinkage of the optical clear glue after solidification, the light-transmitting cover can be attached to the polarizer 200 after the optical clear glue in the first through hole 220 is completely solidified and the upper surface of the solidified optical clear glue is flush with the upper surface of the polarizer 200.

In some implementations of this embodiment, the optical clear glue can be solidified by UV light, and the optical clear double-sided adhesive 400 can also be used to bond the polarizer 200 and the upper glass 310.

The first recess 311 and the second recess 321 can be made by a numerical control machine or by etching or another method.

A glass polishing process can be used for the upper glass 310 and the lower glass 320, to polish the lower surface of the upper glass 310 and the upper surface of the lower glass 320, so as to improve surface flatness of the upper glass 310 and the lower glass 320 and reduce a degree of depression of the upper glass 310 at the first through hole 220 and a degree of depression of the lower glass 320 at the second through hole 331, thereby reducing interference with incident light.

An embodiment of the present invention further discloses an electronic device, which includes the foregoing hole-punch screen.

The electronic device provided in the present invention has the foregoing hole-punch screen. Because the first through hole 220 in the hole-punch screen is filled with the optical clear glue, no gap is created between the polarizer 200 and the glass component 300 as well as between the polarizer 200 and the light-transmitting cover 100, thereby not affecting appearance and reliability testing, so that camera performance is optimized.

The electronic device in the embodiments of the present invention may be a smart phone, a tablet computer, an e-book reader, a game console, a smart watch, or the like. The embodiments of the present invention do not limit the specific type of the electronic device.

The foregoing embodiments of the present invention focus on the differences between the embodiments. As long as different features of improvement in the embodiments do not conflict, they can be combined to form more preferred embodiments. Further descriptions are omitted herein for the purpose of brevity.

The foregoing descriptions are only embodiments of the present invention, but the present invention is not limited to such embodiments. For a person skilled in the art, the present invention may have various changes and variations. Any modification, equivalent replacement, or improvement made without departing from the spirit and principle of the present invention shall fall within the protection scope of the claims of the present invention.

What is claimed is:

1. A hole-punch screen, comprising:
   a light-transmitting cover;
   a polarizer, wherein the polarizer is attached to the light-transmitting cover, the polarizer is provided with a first through hole, and the first through hole is filled with optical clear glue; and
   a glass component, wherein the glass component is attached to the polarizer, the polarizer is located between the light-transmitting cover and the glass component, and the glass component is provided with a second through hole at a position corresponding to the first through hole;

wherein the glass component comprises:

upper glass, wherein the upper glass is attached to the polarizer, the upper glass is provided with a first recess at a position corresponding to the first through hole, and the first recess is located on a first side of the upper glass facing away from the polarizer;

lower glass, wherein the lower glass is attached to the upper glass via a frame adhesive;

support columns located between the upper glass and the lower glass; and foam, wherein the foam is located on a side of the lower glass facing away from the upper glass, and the second through hole is located in the foam;

wherein the lower glass is provided with a second recess at a position corresponding to the first recess, and the second recess is located on a second side of the lower glass facing the upper glass;

wherein the upper glass is further provided with a first groove at a position corresponding to the first through hole, and the first groove is located on a third side of the upper glass facing the polarizer, where the first side of the upper glass and the third side of the upper glass are opposite sides of the upper glass; wherein a first recess bottom of the first recess has an arc surface, and the first recess bottom has a same shape as the first groove;

wherein the lower glass is further provided with a second groove at a position corresponding to the first recess, and the second recess is located on a fourth side of the lower glass facing away from the upper glass, where the second side of the lower glass and the fourth side of the lower glass are opposite sides of the upper glass; wherein a second recess bottom of the second recess has an arc surface, and the second recess bottom has a same shape as the second groove.

2. The hole-punch screen according to claim 1, wherein an outer side of the arc surface faces towards the first through hole.

3. The hole-punch screen according to claim 2, wherein a cross section of the first recess is round, and a diameter of the first recess is equal to a diameter of the first through hole.

4. The hole-punch screen according to claim 1, wherein a contact area between the support columns and the upper glass is less than a contact area between the support columns and the lower glass.

5. The hole-punch screen according to claim 4, wherein a cross-sectional area of the support columns gradually increases in a direction from the upper glass toward the lower glass.

6. The hole-punch screen according to claim 1, wherein a volume of the optical clear glue is greater than a capacity of the first through hole.

7. The hole-punch screen according to claim 1, wherein the polarizer is attached to the light-transmitting cover via an optical clear double-sided adhesive.

8. An electronic device, comprising a hole-punch screen, wherein the hole-punch screen comprises:

a light-transmitting cover;

a polarizer, wherein the polarizer is attached to the light-transmitting cover, the polarizer is provided with a first through hole, and the first through hole is filled with optical clear glue; and a glass component, wherein the glass component is attached to the polarizer, the polarizer is located between the light-transmitting cover and the glass component, and the glass component is provided with a second through hole at a position corresponding to the first through hole;

wherein the glass component comprises:

upper glass, wherein the upper glass is attached to the polarizer, the upper glass is provided with a first recess at a position corresponding to the first through hole, and the first recess is located on a first side of the upper glass facing away from the polarizer;

lower glass, wherein the lower glass is attached to the upper glass via a frame adhesive;

support columns located between the upper glass and the lower glass; and foam, wherein the foam is located on a side of the lower glass facing away from the upper glass, and the second through hole is located in the foam;

wherein the lower glass is provided with a second recess at a position corresponding to the first recess, and the second recess is located on a second side of the lower glass facing the upper glass;

wherein the upper glass is further provided with a first groove at a position corresponding to the first through hole, and the first groove is located on a third side of the upper glass facing the polarizer, where the first side of the upper glass and the third side of the upper glass are opposite sides of the upper glass; wherein a first recess bottom of the first recess has an arc surface, and the first recess bottom has a same shape as the first groove;

wherein the lower glass is further provided with a second groove at a position corresponding to the first recess, and the second recess is located on a fourth side of the lower glass facing away from the upper glass, where the second side of the lower glass and the fourth side of the lower glass are opposite sides of the upper glass; wherein a second recess bottom of the second recess has an arc surface, and the second recess bottom has a same shape as the second groove.

9. The electronic device according to claim 8, wherein an outer side of the arc surface faces towards the first through hole.

10. The electronic device according to claim 9, wherein a cross section of the first recess is round, and a diameter of the first recess is equal to a diameter of the first through hole.

11. The electronic device according to claim 8, wherein a contact area between the support columns and the upper glass is less than a contact area between the support columns and the lower glass.

12. The electronic device according to claim 11, wherein a cross-sectional area of the support columns gradually increases in a direction from the upper glass toward the lower glass.

13. The electronic device according to claim 8, wherein a volume of the optical clear glue is greater than a capacity of the first through hole.

14. The electronic device according to claim 8, wherein the polarizer is attached to the light-transmitting cover via an optical clear double-sided adhesive.

15. The electronic device according to claim 8, wherein the electronic device is a mobile phone, wherein the hole-punch screen is configured for a front camera of the mobile phone arranged underneath a display screen.

* * * * *

UNITED STATES PATENT AND TRADEMARK OFFICE
CERTIFICATE OF CORRECTION

PATENT NO. : 12,220,900 B2
APPLICATION NO. : 17/750130
DATED : February 11, 2025
INVENTOR(S) : Hongyang Wei Page 1 of 1

It is certified that error appears in the above-identified patent and that said Letters Patent is hereby corrected as shown below:

On the Title Page

Under "(73) Assignees:":
Delete "VIVO COMMUNICATION CO., LTD., Guangdong(CN)" and
Insert --VIVO MOBILE COMMUNICATION CO., LTD., Guangdong(CN)--.

Signed and Sealed this
Fifteenth Day of April, 2025

Coke Morgan Stewart
*Acting Director of the United States Patent and Trademark Office*